US005479130A

United States Patent [19]

McCartney

[11] Patent Number: 5,479,130

[45] Date of Patent: Dec. 26, 1995

[54] AUTO-ZERO SWITCHED-CAPACITOR INTEGRATOR

[75] Inventor: Damien McCartney, Raheen, Ireland

[73] Assignee: Analog Devices, Inc., Norwood, Mass.

[21] Appl. No.: 196,597

[22] Filed: Feb. 15, 1994

[51] Int. Cl.$^6$ ........ H03F 1/08

[52] U.S. Cl. ........ 327/341; 327/561; 327/337; 330/9; 333/173

[58] Field of Search ........ 307/490, 491, 307/494, 498, 353, 354, 352; 328/127, 151, 162, 165; 330/9, 107, 109, 257; 333/173

[56] References Cited

U.S. PATENT DOCUMENTS

| | | | |
|---|---|---|---|
| 4,365,204 | 12/1982 | Hague | 322/341 |
| 4,393,351 | 6/1983 | Gregorian et al. | 322/337 |
| 4,439,693 | 3/1984 | Lucas et al. | 307/353 |
| 5,168,179 | 12/1992 | Negahban-Hagh | 328/127 |

OTHER PUBLICATIONS

Electronic Letters, vol. 27, No. 24, Nov. 21, 1991 pp. 2277–2279, Shafeeu H. et al. "Novel Amplifier Gain Insensitive Switched Capacitor Integrator with Same Sample Correction Properties".

Proceedings of the International Symposium on Circuits and Systems, Portland May 8, 11, 1989, vol. 3 of 3. May 8, 1989, Institute of Electrical and Electronics Engineers, pp. 1712–1715, XP 000131392.

Chang Jou I et al., "The Characteristic Comparison of Fully Differential Switched Capacitor Biquads" See FIGS. 1 and 2 (Received Complete Copies as Aug. 25, 1995).

Nagaraj, K., Vlach, J., Viswanathan, T. R., and Singhal, K.: "Switched–capacitor integrator with reduced sensitivity to finite amplifier gain", Electronics Letters, vol. 22, 1986, pp. 1102–1105.

Larson, L. E., and Temes, G. C.: "Switched–capacitor building–blocks with reduced sensitivity to finite amplifier gain, bandwidth, and offset voltage", ISCAS, 1987, pp. 334–338.

Hurst, P. J., and Levinson, R. A.: "Delta–Sigma A/Ds with reduced sensitivity to op amp noise and gain", ISCAS, 1989, pp. 254–257.

*Primary Examiner*—Timothy P. Callahan
*Assistant Examiner*—Dinh T. Le
*Attorney, Agent, or Firm*—Wolf, Greenfield & Sacks

[57] ABSTRACT

A switched-capacitor auto-zero integrator includes and integrator circuit and a correction circuit. The integrator circuit may be any circuit including an operational amplifier having an input line and an output line, an input capacitor coupled to be charged by an Input voltage, an integrating capacitor coupled to the output line, and at least one integrating switch operable during an integrating time interval to connect the input capacitor to the integrating capacitor such that the integrating capacitor is charged to compensate for charge of the input capacitor. The correction circuit includes an offset capacitor coupled to the input line and at least one correction switch operable in an auto-zero sub-interval: and a correction sub-interval. The sub-intervals occur only during the integrating interval such that the offset capacitor is charged by an offset voltage and a gain error voltage of the operational amplifier during the auto-zero sub-interval and the offset capacitor is connected to a summing node between the input capacitor and the integrating capacitor during the correction sub-interval.

16 Claims, 6 Drawing Sheets

AUTO-ZERO SWITCHED-CAPACITOR INTEGRATOR

FIELD OF THE INVENTION

The present invention relates to an "auto-zero" circuit and, more particularly, to a switched-capacitor integrator circuit exhibiting reduced operational amplifier ("op amp") input offset voltage and gain errors.

BACKGROUND OF THE INVENTION

Switched-capacitor circuits have widespread use due to the advancement of CMOS technology. CMOS technology is commonly used to implement switched-capacitor circuits because of the availability of MOSFET switches and op amps with low input bias currents. One common type of switched-capacitor circuit is a switched-capacitor integrator. CMOS switched-capacitor integrator circuits are commonly used in sigma delta analog-to-digital converters. Such CMOS switched-capacitor integrator circuits typically include switches, capacitors and op amps.

CMOS technology produces switches and capacitors with high performance and yield. CMOS op amps, however, suffer from a number of drawbacks. Particularly, CMOS op amps typically have input offset voltages within the range of 1–10 mv (whereas ideally the input offset voltage should be zero). During operation, the difference between the voltages on the input terminals of the op amp will be equal to the input offset voltage, when the output voltage is at zero volts. In addition, such op amps typically have a finite gain within the range of 100–1,000,000 (though ideally the gain should be infinite). As a result of the finite gain, there exists an additional error voltage between the op amp input terminals that varies as the output voltage varies, causing inaccurate performance. Therefore, CMOS op amps can significantly adversely affect the accuracy of the circuit in which they are used.

To compensate for the non-ideal performance of CMOS op amps, there exist a number of prior art switched-capacitor circuits with auto-zeroing features useful for reducing op amp offset voltage and gain errors. Among these prior art auto-zero circuits, the simpler circuits attempt to compensate for the input offset voltage and gain error voltage either by measuring the value of the offset voltage and gain error voltage while ignoring the output voltage completely or by measuring the value of the offset voltage while making assumptions about the final value of the output voltage based on the value of the output voltage during a proceeding clock phase. Such circuits operate inaccurately if the op amp gain is too low and/or the output voltage significantly varies between clock phases (which variation is common with certain switched capacitor circuits such as sigma-delta integrators). The more complex circuits, while operating more accurately, require additional circuitry for determining the final value of the output voltage.

FIG. 1 shows a prior art, switched-capacitor auto-zero integrator. This prior art circuit (the Nagaraj circuit) was introduced by K. Nagaraj in Magaraj, K., Vlach, J., Viswanathan, T. R. and Singhal, K., "Switched-Capacitor Integrator with Reduced Sensitivity to Finite Amplifier Gain," *Electronics Letters,* Vol. 22, 1986, pp. 1102–1105, which is herein incorporated by reference. The Nagaraj circuit aims to reduce op amp offset voltage and gain errors by measuring the offset voltage and gain error voltage and thereafter compensating for them.

The Nagaraj circuit includes an input line 10 and an op amp 12. The op amp has an inverting input line 16 a non-inverting input line 18 and an output line 14. Also included are an input capacitor $C_1$ connected between input node N1 and summing node N3, an integrating capacitor $C_2$ connected between integration-node N2 and the output line 14, and an offset capacitor $C_3$, connected between summing node N3 and the inverting input line 16.

The circuit also includes three switches (S1, S2 and S3) operable (i.e., closed) when control signal Φ1 is high, and two switches S4 and S5 operable when a control signal Φ2 high. Switch S1 is connected between input node N1 and ground, switch S2 is connected between summing node N3 and ground, and switch S3 is connected between the inverting input line 16 and integration node N2. Switch S4 is connected between the input line 10 and input node N1 and switch S5 is connected between summing node N3 and integration node N2.

Shown in the timing diagram of FIG. 4 are the control signals Φ1 and Φ2 which respectively control the operation of the Φ1 switch set (S1, S2 and S3) and the Φ2 switch set (S4 and S5). (Signals Φ1 and Φ2 are shown on the same time axis and the vertical placement of one above the other does not signify that one attains different voltage levels than the other; the "high" and "low" voltage levels of the signals are relative to each other only). As is conventional for a switched-capacitor integrator, the Φ1 and Φ2 switch sets of the Nagaraj circuit operate in two non-overlapping time intervals (or clock phases). During interval 1, signal Φ1 is at a "high" voltage level and signal Φ2 is at a "low" voltage level. During interval 2, signal Φ1 is low and signal Φ2 is high. Signal Φ1 controls the Φ1 switch set (S1, S2 and S3) such that, during interval 1 (when Φ1 is high), switches S1, S2 and S3 are closed and during interval 2 (when Φ1 is low), switches S1, S2 and S3 are opened. Conversely, because the Φ2 switch set (S4 and S5) is controlled by control signal Φ2, switches S4 and S5 are open during interval 1 and are closed during interval 2. It is important that the signals Φ1 and Φ2 are not high at the same time so that the input voltage is not lost through switches S4 and S1 to ground. Thus as will be understood by those skilled in the art the circuit typically applies a "break-before-make" operation to ensure that the control signals are not simultaneously high.

During interval 1, the input capacitor $C_1$ is connected to ground through switches S1 and S2. This arrangement resets the input capacitor $C_1$ to zero charge (and voltage). During the interval 2, switches S1, S2 and S3 are opened and switches S4 and S5 are closed. The input capacitor $C_1$ is charged to the input voltage $V_{in}$ (received through input line 10) through switch S4, and the integrating capacitor $C_2$ is (ideally) charged to the same charge to compensate for the charge on the input capacitor $C_1$. As will be understood by those skilled in the art, because $C_3$ holds a voltage equal and opposite to the op amp input offset and gain error voltages there is essentially an equipotential surface between the right plate of capacitor $C_1$ and left plate of capacitor $C_2$, $C_3$ being treatable as an open circuit. The combined charge on the right plate of $C_1$ and left plate $C_2$ is shared. (By conservation of charge, of course, the total "charge" on $C_1$, and $C_2$ is unchanged from interval 1 to interval 2). Thus, during interval 2 when the input capacitor $C_1$ is charged by the input voltage $V_{in}$, the output of the op amp moves to a voltage to charge capacitor $C_2$ and compensate for the charge build-up on capacitor $C_1$. The charging of capacitor $C_2$ to compensate for the charge on capacitor $C_1$ is herein referred to as charge "compensation".

The Nagaraj circuit measures the offset voltage and gain error voltage during interval 1 by charging offset capacitor $C_3$ with the offset voltage and gain error voltage of the op amp. By holding this charge on capacitor $C_3$ during integration (interval 2), the circuit attempts to correct for the offset and gain error voltages. The theory is that the voltage on summing node N3 will be reduced, due to the charge held on capacitor $C_3$, which enables accurate integration of the input voltage (while belong insensitive to op amp offset and gain error voltages). The offset voltage and gain error voltage, however, are measured during interval 1 with the output voltage possibly not at its final value (i.e., the value at the end of interval 2). Therefore, if the output voltage changes between interval 1 and interval 2, and thus the gain error voltage changes appreciably between the time intervals, the above-stated simplifications no longer hold true and the Nagaraj circuit will operate inaccurately.

Particularly, during interval 1, while input capacitor $C_1$ is grounded, offset Capacitor $C_3$ will charge up to the voltage: $V_3=V_{OS}-V_{o1}/A$, where $V_{OS}$ is the offset voltage, $V_{o1}$ is the op amp Output voltage at the end of interval 1 and A is the op amp gain. At the same time, input capacitor $C_1$ will be discharged. During interval 2, $C_1$ will be charged by the input voltage $V_{in}$, which charge will cause the integrating capacitor $C_2$ to be charged and the value of the output voltage on output line 14 will change such that the Voltage $V\_$ at the op amp inverting input line 16 will be equal to: $V\_=V_{OS}-V_{o2}/A$, where $V_{02}$ is the op amp output voltage at the end of interval 2. The voltage on summing node N3 will be equal to $V_S=V\_-V_3=(V_{o1}-V_{02})/A$.

Ideally, the voltage $v_S$ at summing node N3 should be equal to zero to ensure perfect charge compensation of integrating capacitor $C_2$ due to the charging of input capacitor $C_1$. In the case where the amplifier gain A is very large for example $\mathbf{10}^6$, the summing node voltage $V_S$ , will be negligible. However, in the case where the amplifier gain A is lower, for example 102 the summing node voltage voltages $V_{01}$ and $V_{02}$, the voltages are so close in value as to produce a small summing node voltage $V_S$ even with a low amplifier gain A. However, in the case of certain CMOS circuits such as sigma-delta modulators, the op amp output changes value significantly from time interval to time interval and, therefore, there exists errors due to finite amplifier gain.

FIG. 2 shows another prior art auto-zero integrator (the Larson circuit) which was introduced by Larson in Larson, L. E., and Temes, G. C. "Switched-Capacitor Building-Blocks with Reduced Sensitivity to Finite Amplifier Gain, Bandwidth, and Offset Voltage," *International Symposium on Circuits and Systems*, 1987, pp. 334–338, which is herein incorporated by reference. The Larson circuit is an improvement over the Nagaraj circuit and measures the offset and gain error voltages based on an estimate of the value of the output voltage at the end of interval 2. The Larson circuit assumes, however, that the input voltage $V_{in}$ remains at the same level during both interval 1 and interval 2. If the input voltage changes between interval 1 and interval 2 (causing the output voltage to change), the Larson circuit will operate inaccurately.

As shown in FIG. 2, the Larson circuit includes two additional capacitors to those of the Nagaraj circuit (like elements are referred to by same reference characters to those in FIG. 1). The extra capacitors $C_4$ and $C_5$ are topologically arranged in parallel with the input capacitor $C_1$ and the integrating capacitor $C_2$, respectively but being controlled by different switches are never physically connected in parallel. In the Larson circuit, the value of $C_4$ equals twice the value of $C_1$ and the value of $C_5$ equals $C_2$. The timing diagram of the control signals Φ1 and Φ2 is shown in FIG. 4 and is identical to that of the Nagaraj circuit. Switches S1, S2 and S6 are controlled by signal Φ1 and switches S4, S5, S7 and S8 are controlled by signal Φ2.

During interval 1, capacitor $C_5$ serves as the integration capacitor and node N4 acts as the summing node. The output moves to a voltage that anticipates the interval 2 output voltage. The left plate of the input capacitor $C_1$ is connected through switch S1 to ground and the right place of input capacitor $C_1$ is connected through switch S2 to node N4 between capacitors $C_4$ and $C_5$. Input capacitor $C_1$ is charged by the offset voltage and gain error voltage of the op amp 12 corresponding to an approximate final output voltage value, assuming the input voltage $V_{in}$ remains at the same level between interval 1 and interval 2. During interval 2, capacitor $C_1$ is further charged by the input voltage $V_{in}$ and the voltage $V_S$ at the summing node N3 will charge to the op amp offset voltage and gain error voltage corresponding to the final value (at the end of interval 2) of the output voltage. If the input voltage $V_{in}$ has not changed between intervals, the voltage $V_S$ will be approximately the same as the voltage on node N4 during interval 1. Consequently, the only charge compensation of integrating capacitor $C_2$ will be due to the charging by input voltage $V_{in}$ of input capacitor $C_1$. In other words, the circuit is insensitive to op amp offset voltage and finite gain.

Not only does the Larson circuit require extra capacitors than does the Nagaraj circuit, but also if the input voltage $V_{in}$ changes value between interval 1 and interval 2, the Larson circuit operates inaccurately.

FIG. 3 shows an even further prior art auto-zero switched-capacitor integrator (the Hurst circuit). The Hurst circuit was introduced by Hurst in Hurst P. J., and Levinson, R. A., "Delta-Sigma A/Ds with Reduced Sensitivity to Op Amp Noise and Gain," *International Symposium on Circuits and Systems*, 1989, pp. 254–257, which is herein incorporated by reference. FIG. 3 includes identical reference characters to denote like elements to those of FIGS. N1 and 2N The timing diagram of switch control signals Φ1 and Φ2 is shown in FIG. 4.

Essentially, in the Hurst circuit, the capacitor $C_4$ in the Larson circuit is split into two capacitors $C_{11}$ and $C_6$ both with value $C_1$. The input voltages $V_{in}(n)$ and $V_{in}(n-0.5)$ are sampled versions of the same voltage at different times. Capacitor $C_{11}$ samples the input voltage $V_{in}$ as $C_4$ did in the Larson circuit and capacitor $C_6$ samples a half-cycle delayed version $V_{in}(n-0.5)$ of the input voltage. Assuming the input voltage $V_{in}(n)$ changes during interval 1, the function of capacitor $C_6$ during interval 1 is to cancel the charge on capacitor $C_1$. Therefore, only the charge from capacitor $C_{11}$ will be integrated by capacitor $C_5$. If the input voltage $V_{in}(n)$ does not change from interval 1 to interval 2, the charge on the right hand plate of capacitor $C_1$ is the same as that during interval 1 and, thus, the only charge compensation occurring between $C_1$ and $C_2$ is due to the input voltage $V_{in}$.

While the Hurst circuit is relatively insensitive to finite op amp gain, the circuit includes three additional capacitors and associated switches (to those of an uncompensated circuit), which increase the manufacturing cost and consume additional area on an integrated circuit chip.

Accordingly, a general object of the present invention is to provide a switched capacitor integrator with an auto-zeroing capability for accurately reducing offset voltage and gain errors which otherwise would be introduced by the op amp and which integrator will be relatively simple and inexpensive to implement.

SUMMARY OF THE INVENTION

The aforementioned drawbacks of the prior art switched-capacitor auto-zero integrators are overcome by an integrator of the present invention. In this integrator, a first set of switches operate in first and second time intervals such that the circuit conventionally integrates an input voltage; and a second set of switches operate in first and second sub-intervals, which occur during the second interval, such that the circuit compensates for the offset voltage and gain error voltage of an operational amplifier of the integrator.

More particularly, according to the invention, the switched-capacitor auto-zero integrator includes an integrator circuit and a correction circuit. The integrator circuit includes an input line for receiving an input voltage, an operational amplifier having an input and an output, and a plurality of integrating switches operable in the first and second time intervals. An input capacitor is connected to the input line through at least one of the integrating switches such that the input capacitor is charged by the input voltage during an integrating time interval. An integrating capacitor is connected to the output of the operational amplifier and to the input capacitor through at least another of the integrating switches such that the integrating capacitor is charged to compensate for charge on the input capacitor during the integrating time interval. The correction circuit includes an offset capacitor and a plurality of correction switches operable in an auto-zero sub-interval and a correction sub-interval. The sub-intervals occur only during the integrating interval. The offset capacitor is charged by an offset voltage and gain error voltage of the op amp during the auto-zero sub-interval and the offset capacitor is connected to a summing node between the input capacitor and the integrating capacitor during the correction sub-interval. Thus, the summing node voltage is reduced to approximately zero volts resulting in accurate charge compensation and integration of the input voltage.

In accordance with a preferred embodiment of the present invention, the duration of the auto-zero sub-interval is greater than the duration of the correction sub-interval.

Other advantages, novel features and objects of the invention will become apparent from the following detailed description of the present invention when considered in conjunction with the accompanying drawing.

DETAILED DESCRIPTION

Figure 1:
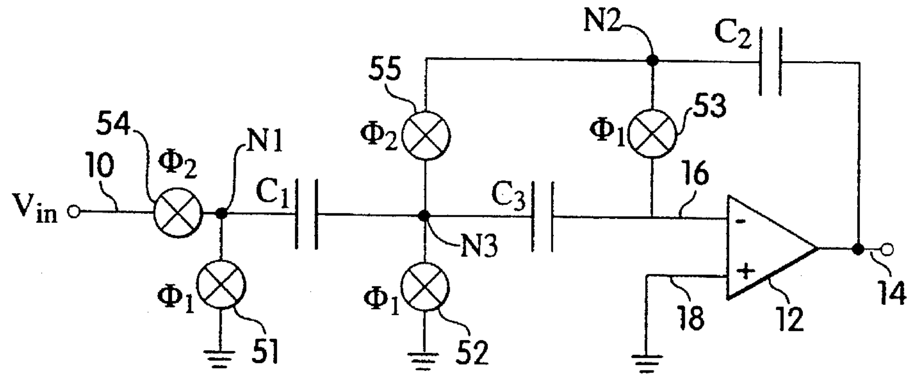
Fig. 1 (Prior Art)
FIG. 1 is a schematic diagram of a first prior art switched-capacitor auto-zero integrator.
Figure 2:
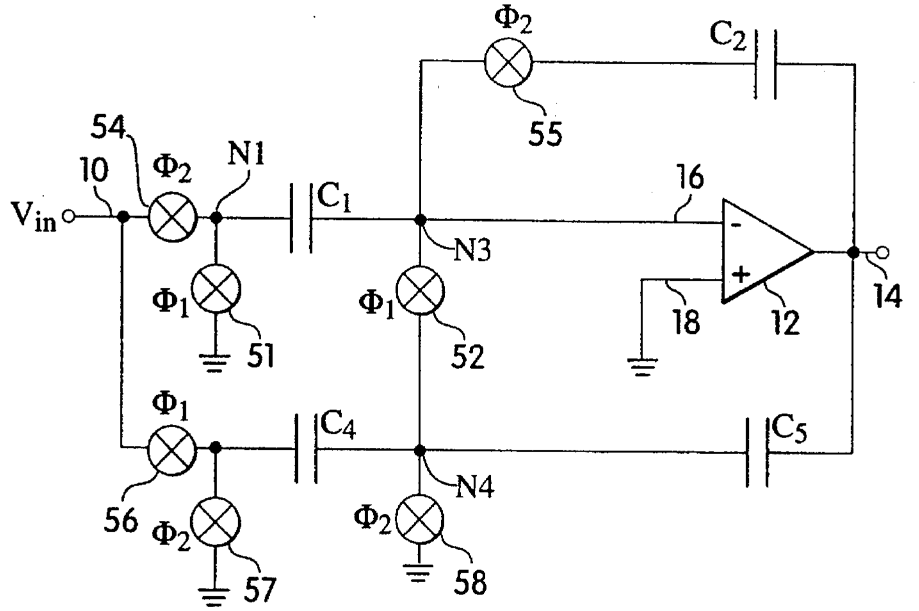
Fig. 2 (Prior Art)
FIG. 2 is a schematic diagram of another prior art switched-capacitor auto-zero integrator.
Figure 3:
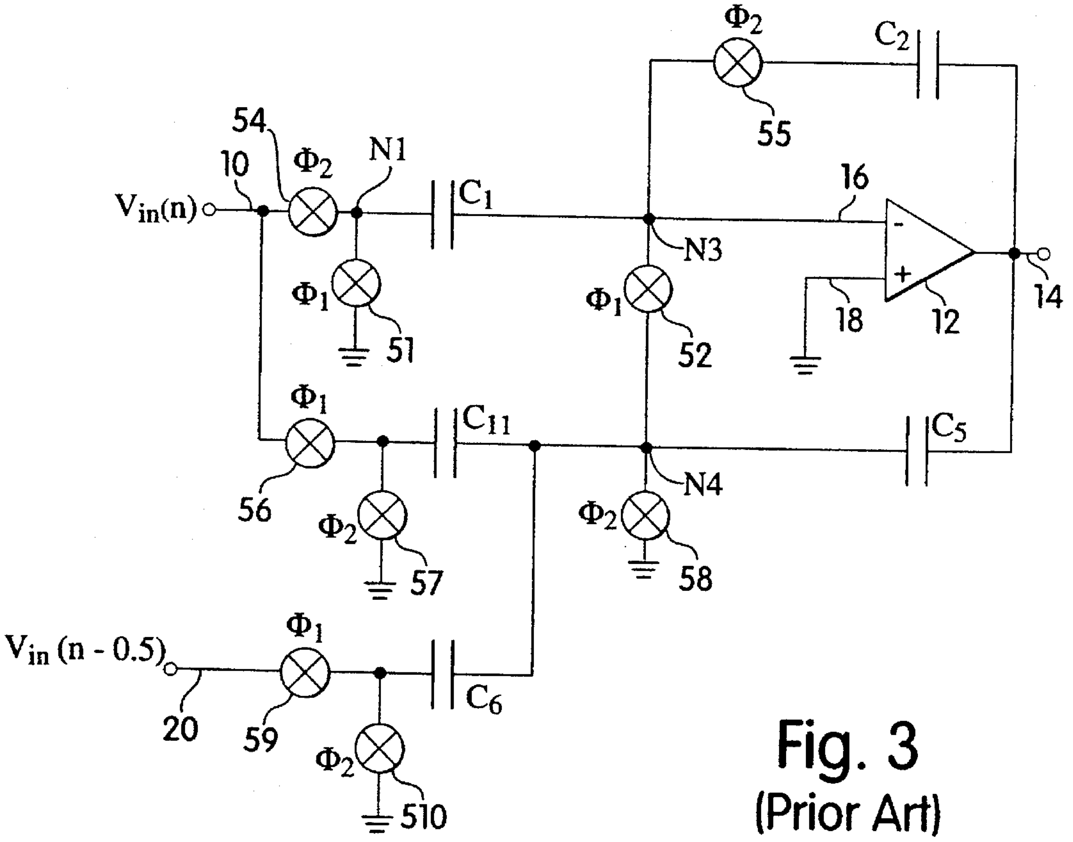
Fig. 3 (Prior Art)
FIG. 3 is a schematic diagram of an even further prior art switched-capacitor auto-zero integrator.
Figure 4:
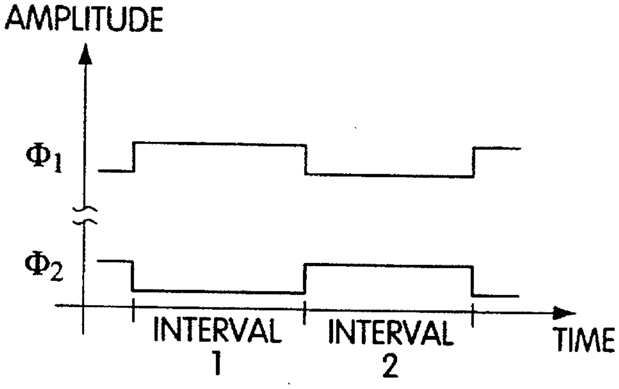
Fig. 4 (Prior Art)
FIG. 4 is a timing diagram of the control signals which control operation of the switches of the prior art circuit of FIGS. 1, 2, and 3.
Figure 5:
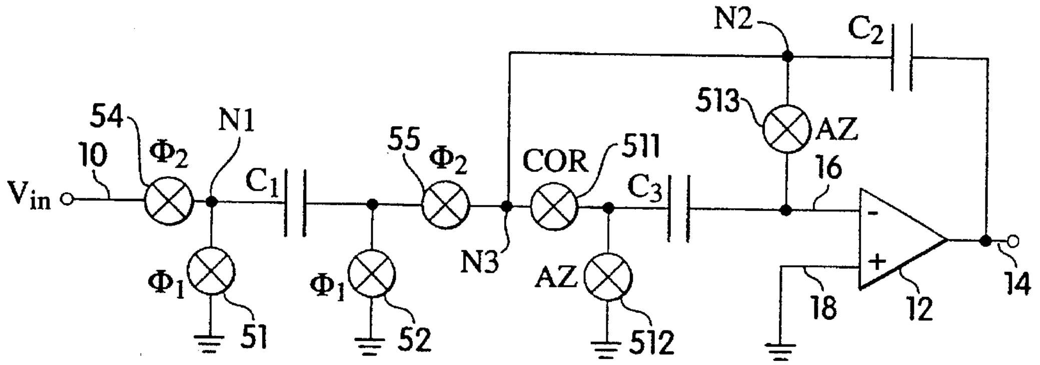
FIG. 5 is a schematic diagram of one embodiment of a switched-capacitor auto-zero integrator of the present invention.

FIG. 5 shows the switched-capacitor integrator circuit of the present invention. FIG. 5 includes identical reference characters to denote like elements to those of FIGS. 1, 2 and 3. Unlike the prior are circuits; with the circuit of the present invention it is not necessary for accurate performance to anticipate the final value of the output voltage at interval 2 during interval 1. Rather, the circuit "waits" until close to the end of interval 2 before completing the measuring of the offset voltage and gain error voltage.

Figure 9:
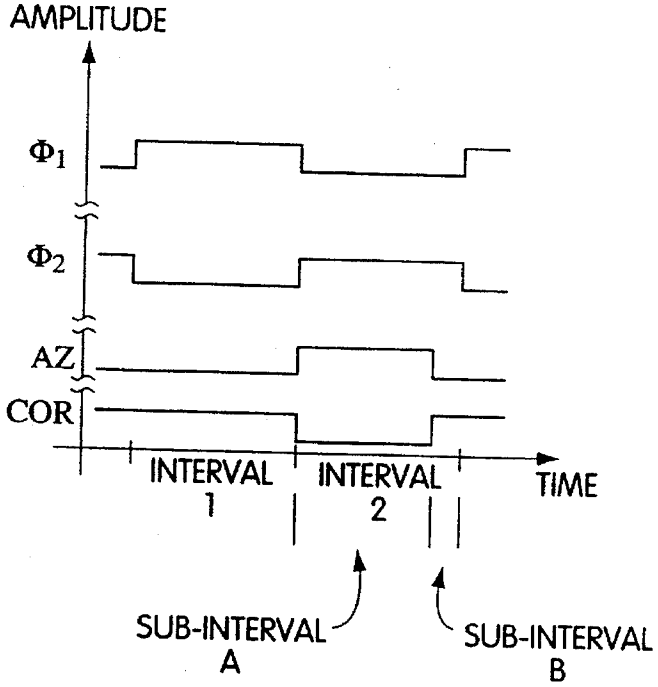
FIG. 9 is a timing diagram of the control signals which control operation of the switches in the embodiments of FIGS. 5, 6, 7 and 8 of the circuit of the present invention.

As can be seen in the timing diagram of FIG. 9, control signal AZ and control signal COR essentially "split" interval 2 into two sub-intervals. Signal AZ is high for a first portion (sub-interval A), about the first 75% for example, of interval 2 and is low for a second portion (sub-interval B), about the last 25% for example, of interval 2. Conversely, signal COR is low during sub-interval A and is high during sub-interval B. Thus, the switches S12 and S13 (controlled by signal AZ) are closed during sub-interval A and are open during sub-interval B. Conversely, switch S11 (controlled by signal COR) is open during sub-interval A and is closed during sub-interval B. Sub-interval A is herein also referred to as the "auto-zero sub-interval" and sub-interval B is also referred to as the "correction sub-interval".

During interval 1, the circuit of the present invention operates as follows: input capacitor $C_1$ is grounded through switches S1 and S2 and switch S11 is closed.

Interval two includes the two sub-intervals. During the auto-zero sub-interval (A), switches S12 and S13 are closed and the offset capacitor $C_3$ is charged by the offset voltage and gain error voltage of of op amp 12. Additionally, the input capacitor $C_1$ is charged by the input voltage $V_{in}$ (received on input line 10) and integrating capacitor $C_2$ is charged to compensate for the charge on capacitor $C_1$. During the correction sub-interval (B), switch S11 is closed and thus the charge on capacitor $C_3$ causes the voltage $V_S$ at the summing node N3 to "move" to a value very close to zero volts, enabling a near perfect charge compensation of integrating capacitor $C_2$ due to charge on input capacitor $C_1$ (i.e., the integrating capacitor $C_2$ is charged by the same amount that input capacitor $C_1$ is charged).

If $V_{02}'$ is the output voltage during the auto-zero sub-interval, the offset capacitor $C_3$ will be charged by the voltage: $V_3=V_{OS}-V_{02}'/A$. To a first order approximation, the voltage $V_S$ on summing node N3 will drop by this same voltage when the correction sub-interval begins. The amplifier output will thus change to: $V_{02}=V_{02}'-(1+C_1/C_2)(V_{OS}-V_{02}'/A$. That is, the change in voltage at the output will be a gained-up version of that at summing node N3. The voltage at the inverting input 16 of the op amp will then be equal to: $V_{-}=V_{OS}-V_{02}/A=V_{OS}-V_{02}'/A+(1+C_1/C_2)(V_{OS}-V_{02}'/A)/A$. The voltage $V_S$ at the summing node N3 will therefore be equal to: $V_S=V_--V_3=(1+C_1/C_2)(V_{OS}-V_{02}'/A)/A$. The voltage $V_S$ includes second order error terms rather than first order error terms as was the case with the prior art Nagaraj circuit. Therefore, the circuit of the present invention will operate accurately despite variations in the input voltage and finite op amp gain.

The gain error term $V_{02}'/A$ changes from one auto-zero sub-interval to another auto-zero sub-interval. The gain error term $V_{02}'/A$ has an associated charge that it "steals" from the summing node N3 during each auto-zero sub-interval. However, this action does not result in a net integrated charge on offset capacitor $C_3$ because the voltage corresponding to this charge is returned to the summing node N3 during the subsequent auto-zero sub-interval as a new gain error voltage charges offset capacitor $C_3$ (and a new gain error charge is taken from the summing node). The reason for this "equalizing" action is that the right plate of the auto-zero capacitor $C_3$ is never discharged to a fixed voltage as is that of input capacitor C1.

Referring to the timing diagram of FIG. 9, it is important that the signal AZ goes low before the signal COR goes high and that signal COR goes low before signal AZ goes high such that the switches respectively controlled by signals AZ and COR are not closed at the same time. If switches S11 (controlled by signal COR) and S12 (controlled by signal AZ) were closed simultaneously, the voltage $V_S$ on summing node N3 could be lost through switches S11 and S12 to ground. Likewise, the charge on capacitor $C_3$ would be discharged through switches S11, S12 and S13 to ground. Thus, the circuit applies a "break-before-make" operation to the control signals to ensure that the signals are not both high at the same time.

Figure 6:
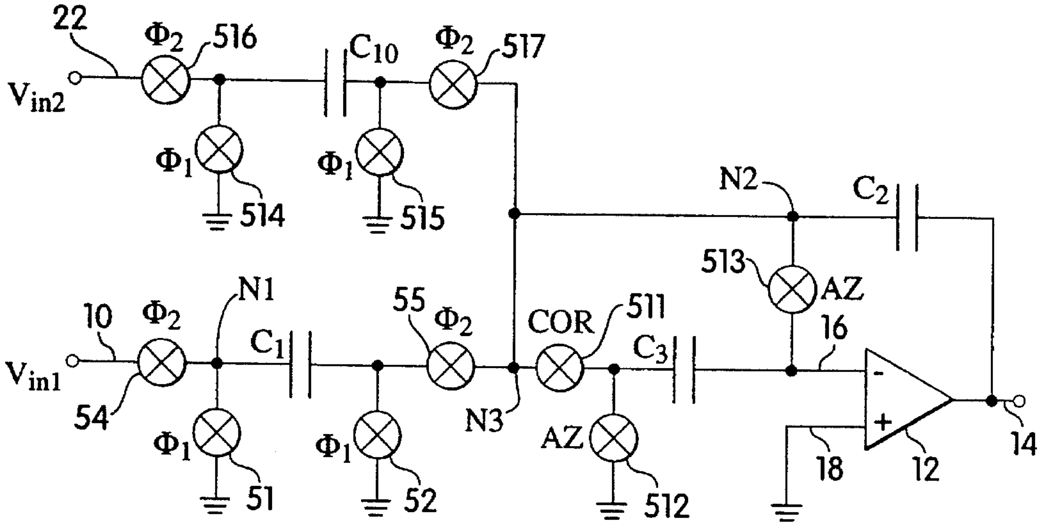
FIG. 6 is a schematic diagram of another embodiment of a switched-capacitor auto-zero integrator of the present invention.

While the auto-zero circuit of the invention has been shown and described with a single input line 10 and a single input capacitor $C_1$, the invention could easily be used with a circuit having multiple input lines and multiple input capacitors with associated switches. Such an arrangement is shown in FIG. 6. As shown, the integrator includes two input input voltages $V_{in1}$ and $V_{in2}$. Input branch 22 has an branches 10 and 22 respectively connected to receive the associated input capacitor C10 and switches S14 and S15 which are controlled by control signal Φ1 and switches S16 and S17 which are controlled by control signal Φ2. The operation of input branch 22 is similar to that of input branch 10 such that during interval 1 the input capacitor $C_{10}$ is grounded. During interval 2, the input capacitor $C_{10}$ is charged by the input voltage $V_{in2}$ and charge compensation occurs, resulting in an equal charging of integrating capacitor $C_2$. Additionally, during the auto-zero sub-interval, offset capacitor $C_3$ is charged by the offset voltage and gain error voltage of the op amp and during the correction sub-interval the offset capacitor is connected through switch S11 to summing node N3, thereby correcting (reducing) the voltage on summing node N3.

Figure 7:
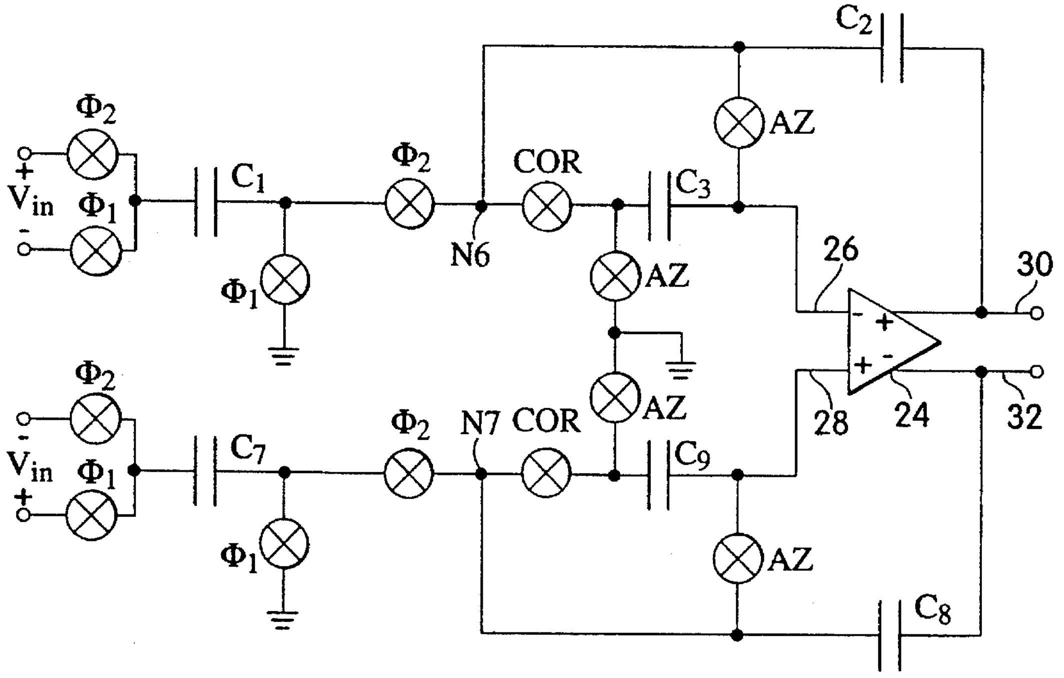
FIG. 7 is a schematic diagram of another embodiment of a switched-capacitor auto-zero integrator of the present invention.

For simplicity, a single,ended version of the circuit of the present invention has been shown (FIG. 5) and described. FIG. 7 shows a differential version of the present invention in which the operational amplifier 24 has two input terminals 26 and 28 and two output terminals 30 and 32. The circuit of FIG. 7 includes two offset capacitors $C_3$ and $C_9$ which charge to the offset voltage and gain error voltage of the op amp 24 during the auto-zero sub-interval and, during the correction sub-interval capacitor $C_3$ is connected to summing node N6 and capacitor $C_9$ is connected to summing node N7, thereby correcting (reducing) the voltages on nodes N6 and N7 respectively. Like the circuits of FIGS. 5 and 6, the correction (reduction) in the summing node(s) voltage(s) provides for near perfect charge compensation.

Figure 8:
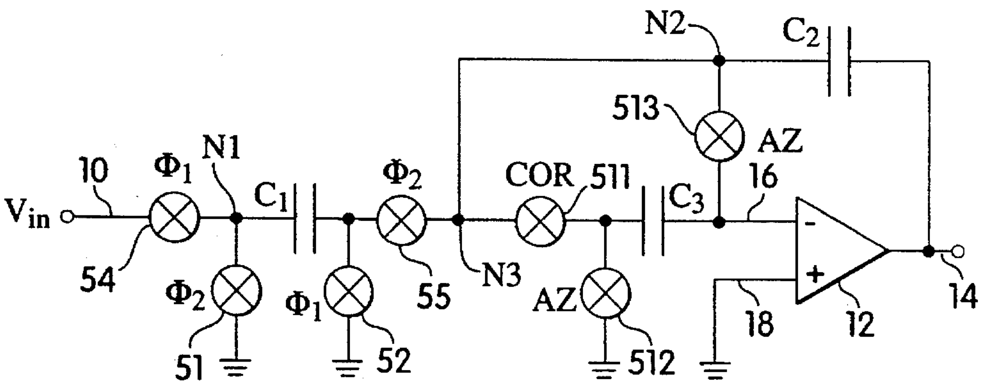
FIG. 8 is a schematic diagram of a further embodiment of a switched-capacitor auto-zero integrator of the present invention.

In addition, while the integrator of the present invention has been shown and described as an inverting integrator, in which the integrator output moves to a negative value in response to positive input voltages, the integrator of the present invention could be a non-inverting integrator simply by interchanging the signals which control switches S1 and S4 such that signal Φ2 controls switch S1 and signal Φ1 controls switch S4, as will be appreciated by those skilled in the art. Such an arrangement is shown in FIG. 8.

Further, the duration of the auto-zero sub-interval was shown and described as being longer than the duration of the correction sub-interval because the integrator shown and described was "integrating" the input voltage $V_{in}$ during sub-interval A and the offset voltage $V_{os}$ during sub-interval B. The input voltage $V_{in}$ is typically greater than the offset voltage $V_{os}$ and, consequently, more time is allowed for integrating the input voltage. As will be appreciated by those skilled in the art, however, interval 2 can be divided differently in accordance with a particular application.

Figure 10:
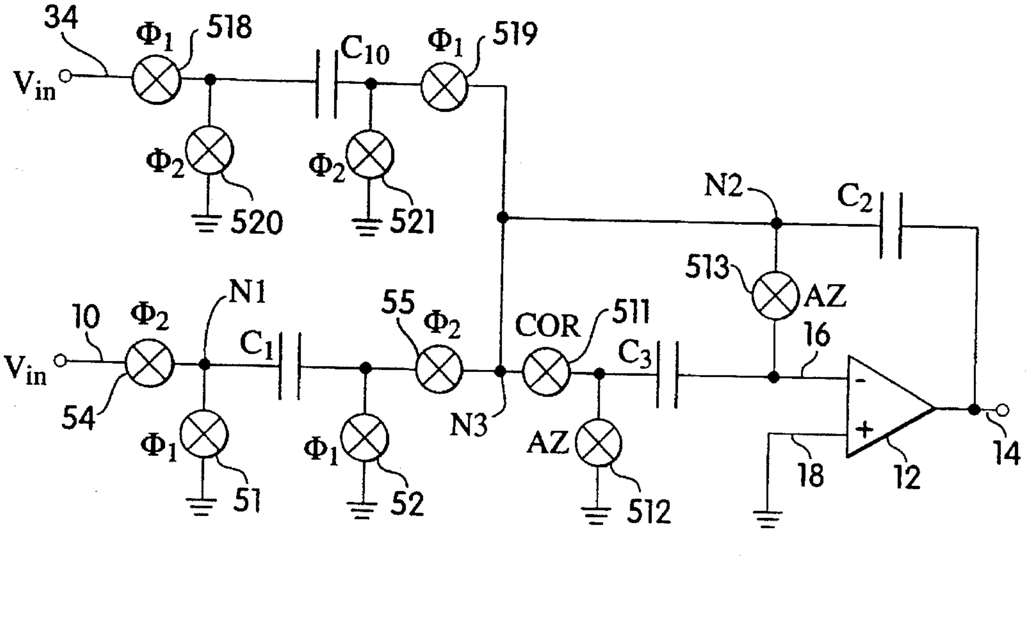
FIG. 10 is a schematic diagram of an even further embodiment of a switched-capacitor auto-zero integrator of the present invention.
Figure 11:
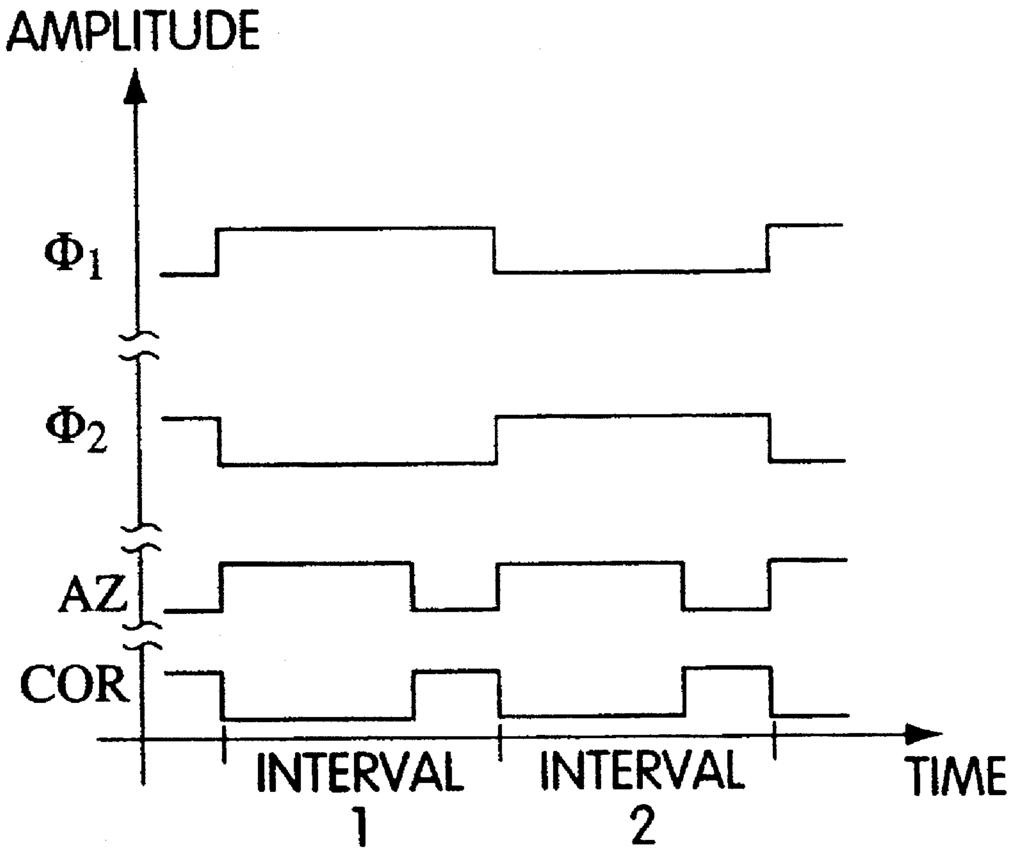
FIG. 11 is a timing diagram of the control signals which control operation of the switches in the FIG. 10 embodiment of the circuit of the present invention.

The embodiments shown and described have divided only the integrating interval into an auto-zero and a correction sub-interval. This division has occurred because charge compensation has occurred only during the integrating interval. It is possible to have an input network during which charge compensation occurs during the first time interval in addition to, or instead of, the second time interval. FIG. 10 shows a circuit embodying the present invention where charge compensation (i.e., the charging of integrating capacitor $C_2$ to compensate for the charging of input capacitor $C_1$) occurs during both time intervals. Therefore, to compensate for op amp offset voltage and finite gain errors interval is also divided into auto-zero and correction sub-intervals. Such a sub-division of interval 1 is shown in the control signal timing diagram of FIG. 11.

While there have been shown and described what are at present considered the preferred embodiments of the present invention, which have been disclosed by way of example only, it would be obvious to those skilled in the art that various changes and modifications can be made therein without departing from the spirit and scope of the invention as presented above and as defined by the appended claims and equivalents thereto.

What is claimed is:

1. A switched-capacitor auto-zero integrator comprising:

an integrator circuit including an operational amplifier having an input line and an output line, an input capacitor coupled to be charged at selected times by an input voltage, an integrating capacitor coupled to the output line, and at least one integrating switch operable during an integration time interval to connect the input capacitor to the integrating capacitor such that the integrating capacitor is charged to compensate for charge on the input capacitor; and a correction circuit including an offset capacitor coupled to the input line and at least one correction switch operable in an auto-zero time sub-interval and a correction time sub-interval, the time sub-intervals occurring only during the integration interval, to connect the offset capacitor such that the offset capacitor is charged by an offset voltage and a gain error voltage or the operational amplifier during the auto-zero time sub-interval and to connect the offset capacitor to a summing node between the input capacitor and the integrating capacitor during the correction sub-interval.

2. The switched-capacitor auto-zero integrator as claimed in claim 1 wherein the at least one correction switch includes first and second correction switches operable to connect the offset capacitor to be charged by the offset voltage and gain error voltage of the operational amplifier during the auto-zero time sub-interval and a third correction switch operable to connect the offset capacitor to the summing node during the correction sub-interval.

3. The switched-capacitor auto-zero integrator as claimed in 2 claim wherein the first and second correction switches are closed during the auto-zero time sub-interval and the third correction switch is closed during the correction time sub-interval.

4. The switched-capacitor auto-zero integrator as claimed in, claim 1 wherein the duration of the auto-zero time sub-interval is longer than the duration of the correction time sub-interval.

5. The switched capacitor auto-zero integrator as claimed in claim 1 further including a second input capacitor coupled to said input line be charged at selected times by a second input voltage.

6. The switched-capacitor auto-zero integrator as claimed in claim 1 wherein the operation amplifier includes a differential operational amplifier having two input lines and two output lines.

7. A switched-capacitor auto-zero integrator comprising:

an integrator circuit including an input line for receiving an input voltage, an operational amplifier having an input and an output, a plurality of integrating switches operable in first and second time intervals, an input capacitor connected to the input line through at least one of the integrating switches such that the input capacitor is charged by the input voltage during at least one of the first and second time intervals, and an integrating capacitor connected to the output of the operational amplifier and to the input capacitor through at least another of the integrating switches such that the integrating capacitor is charged to compensate for charge on the input capacitor during an integrating time interval, the integrating time interval including at least one of the first and second time intervals; and a correction circuit coupled between said input line and said input capacitor including an offset capacitor and plurality of correction switches operable in an auto-zero time sub-interval and a correction time sub-interval, wherein the time sub-intervals occur only during the integrating interval, to connect the offset capacitor such that the offset capacitor is charged by an offset voltage and a gain error voltage of the operational amplifier during the auto-zero time sub-interval and to connect the offset capacitor to a summing node between the input capacitor and the integrating capacitor during the correction time sub-interval.

8. The switched-capacitor auto-zero integrator as claimed in claim 7 wherein the plurality of correction switches includes first and second correction switches operable to connect the offset capacitor such that the offset capacitor is charged by the offset voltage and gain error voltage of the operational amplifier during the auto-zero time sub-interval and a third connection switch operable to connect the offset capacitor to the summing node during the correction time sub-interval.

9. The switched-capacitor auto-zero integrator as claimed in claim 8 wherein the first and second correction switches are closed during the auto-zero time sub-interval and the third correction switch is closed during the correction time sub-interval.

10. The switched-capacitor auto-zero integrator as claimed in claim 7 wherein the duration of the auto-zero time sub-interval is longer than the duration of the correction time sub-interval.

11. The switched-capacitor auto-zero integrator as claimed in claim 7 further including a second input capacitor coupled to said input line be charged at selected times by a second input voltage.

12. The switched-capacitor auto-zero integrator as claimed in claim 7 wherein the operation amplifier includes a differential operational amplifier having two input lines and two output lines.

13. A correction circuit for use in an integrator circuit including an operational amplifier having an input line and an output line, an input capacitor coupled to be charged at selected times by an input voltage, an integrating capacitor coupled to the output line, and at least one integrating switch operable during an integrating time interval to connect the input capacitor to the integrating capacitor such that the integrating capacitor is charged to compensate for charge on the input capacitor, the correction circuit comprising:

an offset capacitor coupled to the input line and at least one correction switch operable in an auto-zero time sub-interval and a correction time sub-interval, the time sub-intervals occurring only during the integrating interval, to connect the offset capacitor such that the offset capacitor is charged by an offset voltage and a gain error voltage of the operational amplifier during the auto-zero time sub-interval and to connect the offset capacitor to a summing node between the input capacitor and the integrating capacitor during the correction time sub-interval.

14. The correction circuit as claimed in claim 13 wherein the plurality of correction switches includes first and second correction switches operable to connect the offset capacitor such that the offset capacitor is charged by the offset voltage and gain error voltage of the operational amplifier during the auto-zero time sub-interval and a third connection switch operable to connect the offset capacitor to the summing node during the correction time sub-interval.

15. The correction circuit as claimed in claim 14 wherein the first and second correction switches are closed during the auto-zero time sub-interval and the third correction switch is closed during the correction time sub-interval.

16. The correction circuit as claimed in claim 13 wherein the duration of the auto-zero time sub-interval is longer than the duration of the correction time sub-interval.

* * * * *